United States Patent
Arora et al.

(10) Patent No.: US 11,651,821 B2
(45) Date of Patent: May 16, 2023

(54) ADAPTIVE PROGRAM VERIFY SCHEME FOR PERFORMANCE IMPROVEMENT

(71) Applicant: Western Digital Technologies, Inc., San Jose, CA (US)

(72) Inventors: Nikhil Arora, Haryana (IN); Lovleen Arora, Punjab (IN)

(73) Assignee: Western Digital Technologies, Inc., San Jose, CA (US)

( * ) Notice: Subject to any disclaimer, the term of this patent is extended or adjusted under 35 U.S.C. 154(b) by 252 days.

(21) Appl. No.: 17/170,498

(22) Filed: Feb. 8, 2021

(65) Prior Publication Data

US 2022/0254415 A1    Aug. 11, 2022

(51) Int. Cl.
| | |
|---|---|
| G11C 7/00 | (2006.01) |
| G11C 11/00 | (2006.01) |
| G11C 16/08 | (2006.01) |
| G11C 16/34 | (2006.01) |
| G11C 16/26 | (2006.01) |
| G11C 16/10 | (2006.01) |

(52) U.S. Cl.
CPC .............. *G11C 16/08* (2013.01); *G11C 16/10* (2013.01); *G11C 16/26* (2013.01); *G11C 16/3459* (2013.01)

(58) Field of Classification Search
CPC ......... G11C 16/08; G11C 16/10; G11C 16/26; G11C 16/3459; G11C 16/349
See application file for complete search history.

(56) References Cited

U.S. PATENT DOCUMENTS

2014/0269090 A1* 9/2014 Flynn ................. G11C 16/3495
                                                365/185.24
2018/0286485 A1* 10/2018 Takizawa ........... G11C 16/0483

\* cited by examiner

*Primary Examiner* — Hien N Nguyen
(74) *Attorney, Agent, or Firm* — Patterson + Sheridan, LLP; Steven H. Ver Steeg (57) ABSTRACT

A data storage device includes a controller coupled to one or more memory devices. The controller is configured to determine one or more first wordlines within the memory device that needs more than one pulse for programming and one or more second wordlines within the memory device that needs one pulse and no program verify. The locations of the one or more first wordlines and the one or more second wordlines are stored in a data structure of the memory device. During program operations, the controller utilizes the data structure to determine whether the one or more wordlines being programmed requires only one pulse and no program verify or a multi-loop program. The data structure is updated after an EPWR and/or XOR parity operation.

20 Claims, 6 Drawing Sheets

ADAPTIVE PROGRAM VERIFY SCHEME FOR PERFORMANCE IMPROVEMENT

BACKGROUND OF THE DISCLOSURE

Field of the Disclosure

Embodiments of the present disclosure generally relate to data storage devices, such as solid state drives (SSDs), and programming operations of the data storage device.

Description of the Related Art

Traditionally, programming operations in flash memory is a multi-step process. Program voltage is applied in incremental pulses for multiple loops. After each loop, the programmed data is internally read by the NAND (i.e., the Boolean operator and logic gate for "NOT AND") in a program verify operation. If the verify passes, then the program operation is successful. However, if the verify fails, then the next loop occurs with an incremented voltage pulse. The multiple loops continues until a maximum number of program loops is reached. If the program verify fails after reaching the maximum number of program loops, then the program operation is termed as a program status failure. By increasing the number of loops required for the program operation, the program operation requires more time to complete.

In single-level cell (SLC) memory, SLC blocks may pass or have a successful program operation with a single program pulse. Furthermore, because SLC memory has a high likelihood to have a successful program operation with a single program pulse, a program verify operation may not be needed. However, for other memory densities, multiple loops including the program verify operation for each loop may be required. However, in both situations, due to grown defects or degradation of memory cells in a die during the life of the memory, the single pulse program may not be sufficient to program data correctly for some of the wordlines. Because there may not be a program verify operation in the single pulse program, subsequent reading of programmed data in a less-than-optimal memory cell may result in read failures and frequent triggering of failure handling mechanisms, if present, or loss of user data.

Thus, there is a need in the art for an adaptive program verify scheme to reduce the effects of degraded or defective memory cells on subsequent program operations.

SUMMARY OF THE DISCLOSURE

The present disclosure generally relates to data storage devices, such as solid state drives (SSDs), and programming operations of the data storage device. The data storage device includes a controller coupled to one or more memory devices. The controller is configured to determine one or more first wordlines within the memory device that needs more than one pulse for programming and one or more second wordlines within the memory device that needs one pulse and no program verify. The locations of the one or more first wordlines and the one or more second wordlines are stored in a map located in firmware. During program operations, the controller utilizes the map to determine whether the one or more wordlines being programmed requires only one pulse and no program verify or a multi-loop program. The map is updated after an EPWR (Enhanced Post Write Read) and/or XOR parity operation.

In one embodiment, a data storage device includes a memory device and a controller coupled to the memory device. The controller is configured to determine one or more first wordlines within the memory device that need more than one pulse for programming and one or more second wordlines within the memory device that need one pulse with zero verifications for programming, generate a map of the one or more first wordlines, store the map in a data structure in firmware, and program the memory device. The programming includes programming the one or more second wordlines with one pulse and zero verifications and programming the one or more first wordlines with more than one pulse.

In another embodiment, a data storage device includes a memory device and a controller coupled to the memory device. The controller is configured to read a data structure within the memory device that indicates one or more first wordlines of the memory device that needs more than one pulse for programming and one or more second wordlines of the memory device that needs one pulse with zero verifications for programming, determine a read failure on at least one wordline of the one or more second wordlines, and append, to the data structure, a notation of the read failure of the at least one wordline of the one or more second wordlines.

In another embodiment, a data storage device includes memory means, means to generate a data structure of wordlines in the memory means that need more than one pulse for programming, and means to append to the data structure an indication of which wordlines have read failures.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to data storage devices, such as solid state drives (SSDs), and programming operations of the data storage device. The data storage device includes a controller coupled to one or more memory devices. The controller is configured to determine one or more first wordlines within the memory device that needs more than one pulse for programming and one or more second wordlines within the memory device that needs one pulse and no program verify. The locations of the one or more first wordlines and the one or more second wordlines are stored in a map located in firmware. During program operations, the controller utilizes the map to determine whether the one or more wordlines being programmed requires only one pulse and no program verify or a multi-loop program. The map is updated after an EPWR and/or XOR parity operation.

Figure 1:
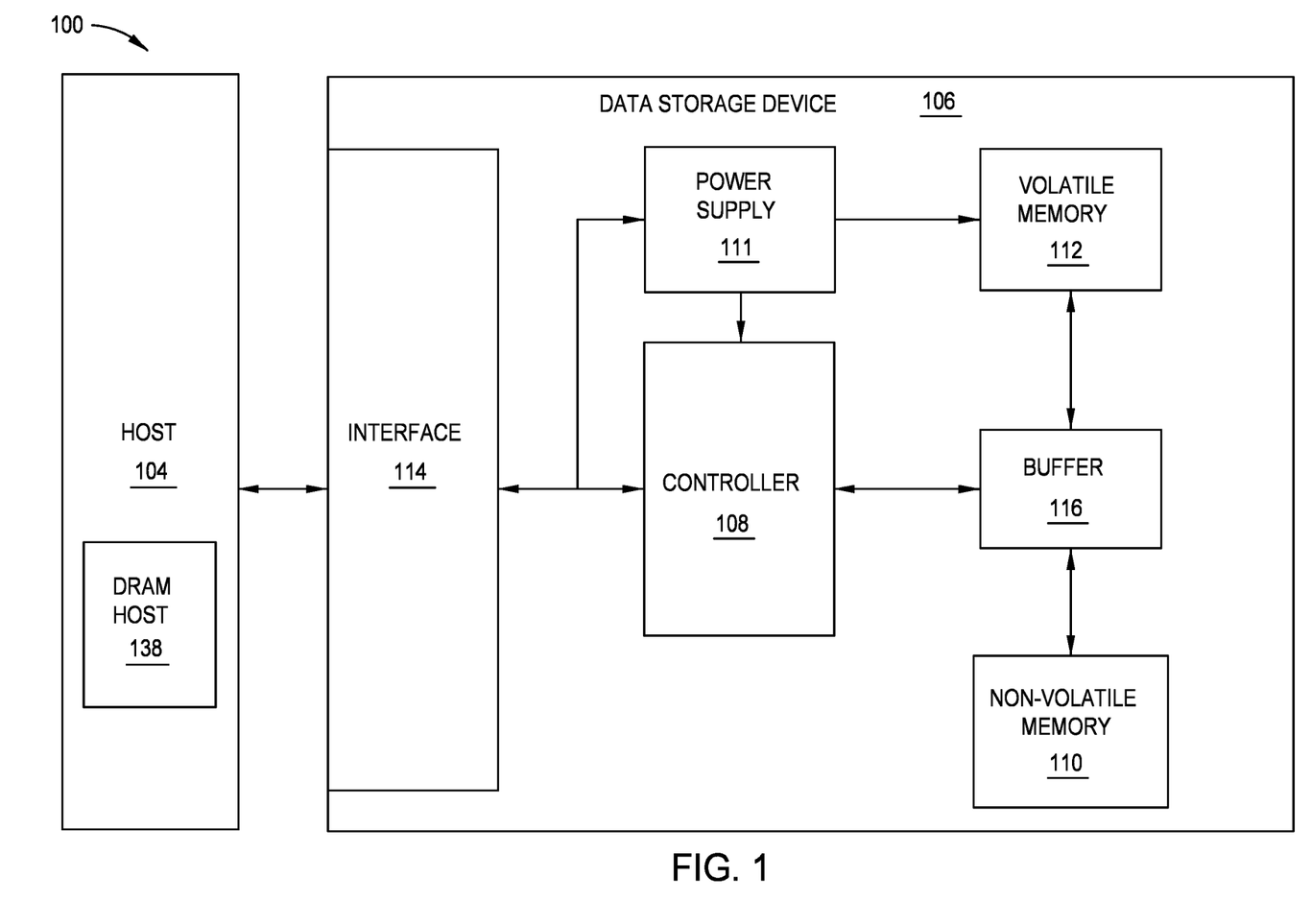
FIG. 1 is a schematic block diagram illustrating a storage system in which data storage device may function as a storage device for a host device, according to certain embodiments.

FIG. 1 is a schematic block diagram illustrating a storage system 100 in which data storage device 106 may function as a storage device for a host device 104, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, an interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe×1, ×4, ×8, ×16, PCIe Mini Card, MiniPCI, etc.). In some examples, the data storage device 106 may be directly coupled (e.g., directly soldered) to a motherboard of the host device 104.

The interface 114 of the data storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The electrical connection of the interface 114 (e.g., the data bus, the control bus, or both) is electrically connected to the controller 108, providing electrical connection between the host device 104 and the controller 108, allowing data to be exchanged between the host device 104 and the controller 108. In some examples, the electrical connection of the interface 114 may also permit the data storage device 106 to receive power from the host device 104. For example, as illustrated in FIG. 1, the power supply 111 may receive power from the host device 104 via the interface 114.

The NVM 110 may include a plurality of memory devices or memory units. NVM 110 may be configured to store and/or retrieve data. For instance, a memory unit of NVM 110 may receive data and a message from the controller 108 that instructs the memory unit to store the data. Similarly, the memory unit of NVM 110 may receive a message from the controller 108 that instructs the memory unit to retrieve data. In some examples, each of the memory units may be referred to as a die. In some examples, a single memory device or the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit of NVM 110 may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR based flash memory devices and may store data based on a charge contained in a floating gate of a transistor for each flash memory cell. In NVM flash memory devices, the flash memory device may be divided into a plurality of dies, where each die of the plurality of dies includes a plurality of blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The data storage device 106 includes a power supply 111, which may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, supercapacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The data storage device 106 also includes volatile memory 112, which may be used by controller 108 to store information. Volatile memory 112 may include one or more volatile memory devices. In some examples, the controller 108 may use volatile memory 112 as a cache. For instance, the controller 108 may store cached information in volatile memory 112 until cached information is written to NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The data storage device 106 includes a controller 108, which may manage one or more operations of the data storage device 106. For instance, the controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic to the NVM 110. In some embodiments, when the data storage device 106 receives a write command from the host device 104, the controller 108 temporarily stores the data associated with the write command in the internal memory or write buffer 116 before sending the data to the NVM 110.

Figure 2:
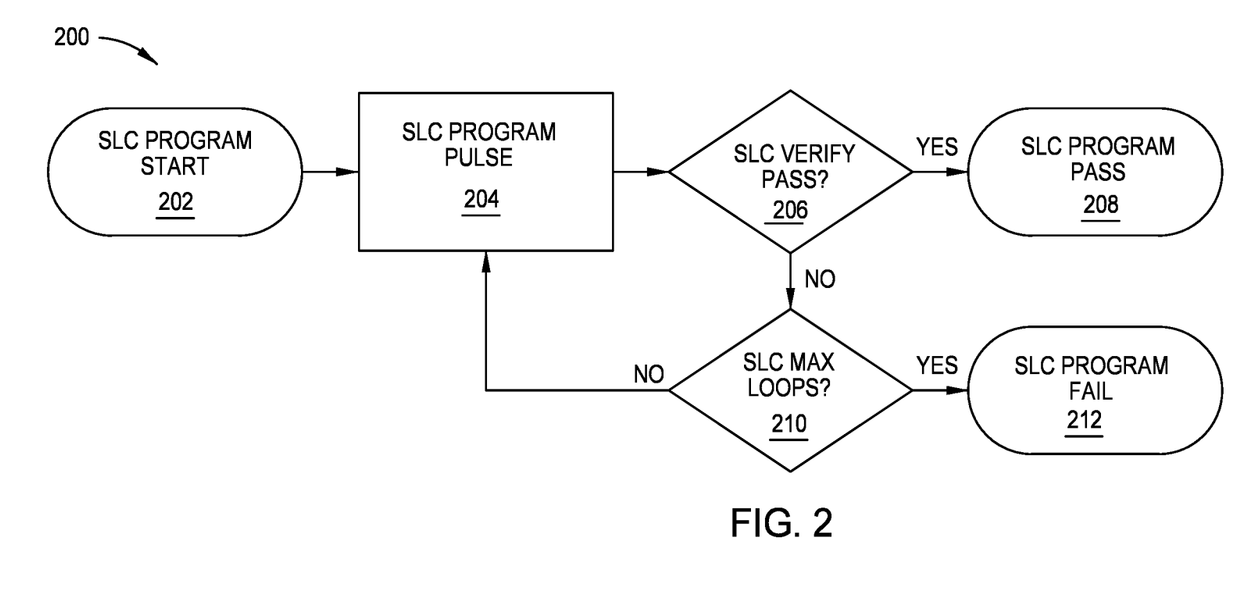
FIG. 2 is a block diagram illustrating a method of determining if a SLC program is successful, according to certain embodiments.

FIG. 2 is a block diagram illustrating a method 200 of determining if a SLC program is successful, according to certain embodiments. At block 202, the SLC program begins. At block 204, a SLC program pulse is applied to the relevant wordline of the NVM, such as the NVM 110. At block 206, the controller determines if the SLC verify passes. If the SLC verify passes at block 206, then the SLC program passes at block 208. However, if the SLC verify does not pass at block 206, then the controller determines if the SLC max loops (i.e., the maximum number of program pulses to be performed) has been reached at block 210. If the SLC max loops has been reached at block 210, then the SLC program fails at block 212. However, if the SLC max loops has not been reached at block 210, then the method 200 returns to block 204, where an additional SLC program pulse is applied to the relevant wordline. The additional SLC program pulse may be the same or greater voltage as the previous SLC program pulse applied to the relevant wordline.

Figure 3:
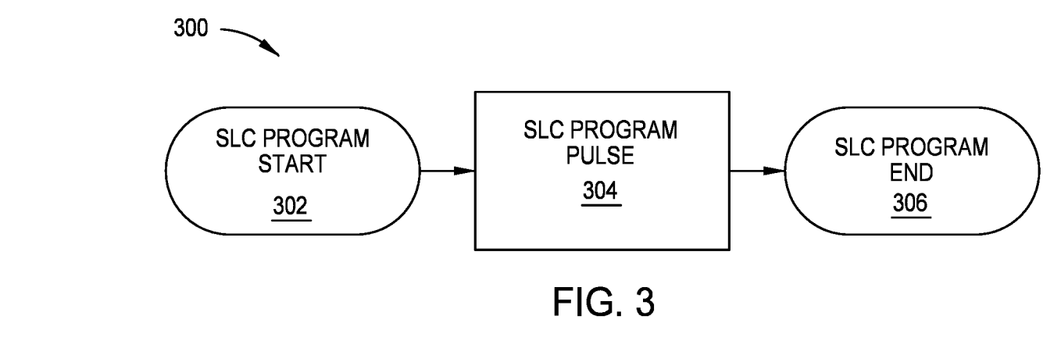
FIG. 3 is a block diagram illustrating a method of a SLC program, according to certain embodiments.

FIG. 3 is a block diagram illustrating a method 300 of a SLC program, according to certain embodiments. At block 302, the SLC program begins. At block 304, a SLC program pulse is applied to the relevant wordline of the NVM, such as the NVM 110. Because the majority of SLC blocks can pass programs with a single program pulse and be within margins to meet all reliability requirements, the SLC verify may not be needed. Thus, the SLC program operation only utilizes the single program pulse due to the confidence that the SLC block is within margins to meet all reliability requirements. By only utilizing the single program pulse in the SLC program operation, the time to program may be decreased, such as from about 102 μs to about 62 μs. At block 306, the SLC program ends. Because there is no SLC verify operation, the status of the SLC block is not updated.

Figure 4:
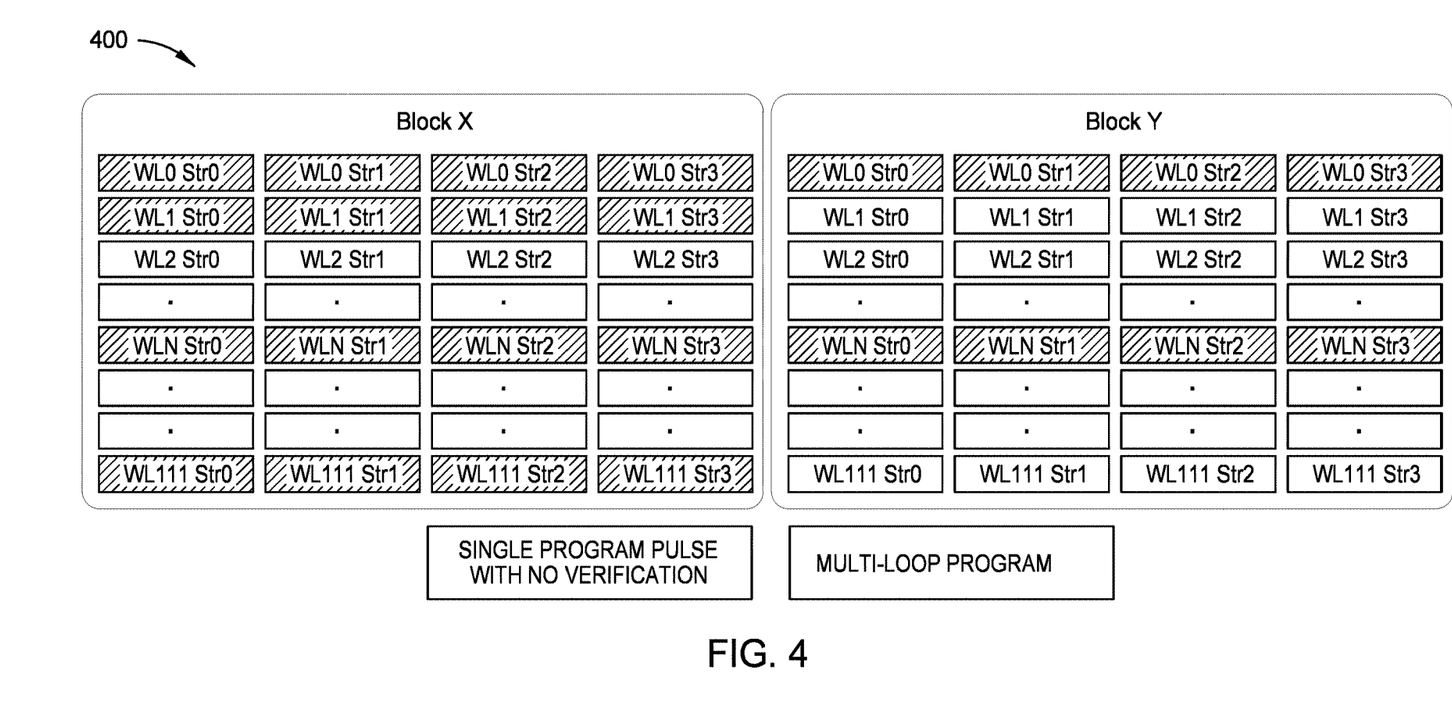
FIG. 4 is a schematic block diagram illustrating a map of wordlines, according to certain embodiments.

FIG. 4 is a schematic block diagram illustrating a map of wordlines, according to certain embodiments. It is to be understood that the term "map" may refer to data structure, herein. Block X and Block Y are examples of blocks of the NVM, such as the NVM 110 of FIG. 1. Block X and Block Y may have any number of wordlines applicable to the block, such as 112 wordlines. Furthermore, Block X and Block Y are examples of memory blocks, such that each wordline (WL) has four strings (Str). In some examples, Block X and Block Y are SLC memory. In other examples, Block X and Block Y are MLC, TLC, or QLC memory.

During quality and assurance, such as during the initial memory health evaluation on the memory, or during memory testing, a map of the wordlines is generated. The map includes information on which wordlines are considered as "good" or within reliability requirements and which wordlines are considered as "bad" or outside of reliability requirements. The wordlines considered as "good" includes a different indication than the wordlines considered as "bad". As shown in Block X, WL0 and WL1 are mapped as "bad" or outside of reliability requirements. Thus, in order to program to the WL0 and WL1 of Block X, a multi-loop program is utilized, such as the method 200 of FIG. 2. As further shown in Block X, WL2 is mapped as "good" or within reliability requirements. Thus, a single SLC program pulse, such as the SLC program pulse of block 304 of FIG. 3, without a SLC verify operation is utilized to program to the WL2.

During the data storage device operation, such as the data storage device 106 of FIG. 1, there may be grown defects or degradation of memory cells in a die, because of which single pulse program may not be sufficient to program data correctly for some of the wordlines. Because of the no SLC verify operation in this mode, no program failure statuses are reported. For example, a wordline in a block may degrade with read/write cycling and will not be able to program with a single pulse of programming. Such degradation will lead to read failure and frequent trigger of failure handling mechanisms, if present, or otherwise loss of user data. Failure handling mechanisms may include, but are not limited to, error correction code (ECC) and/or enhanced post write read (EPWR). When a failure handling mechanism is utilized on a wordline, the map is updated, such that when programming to the wordline in a subsequent operation, the multi-loop program is utilized.

In some examples, the map may include a list of wordlines that requires more than one program pulse for programming and/or a list of wordlines that have a failed bit count (FBC) larger than a threshold. The map may be initially generated during the manufacturing and testing of the NVM 110, where an Erase-Program-Read operation is executed on the array. Based on the data storage device recommendation, a criterion is defined in terms of number of loops during program or the FBC with the single SLC program pulse and no SLC verify. The criterion is utilized to mark all the wordlines that are susceptible to reliability failures if the single SLC program pulse and no SLC verify operation is completed on the wordline. The marked and unmarked wordlines are stored in a map and recorded in the NVM 110. The map may also be stored in the Userrom. The Userrom is a dedicated set of blocks accessible by the controller and not by the host device, such as the host device 104. During the firmware download, the map may be read by the firmware and/or controller 108. The map is then stored in either the NVM 110 or the Userrom.

The map may be updated after the SLC program is completed utilizing various data protection techniques. For example, after the SLC program, EPWR is done on all the relevant WLs. After EPWR pass, there is no protection for read failures on these blocks. In another example, after the SLC program, XOR parities stored in the system are used to recover read failures on the relevant WLs. If either of the data protection techniques are utilized on one or more wordlines, the map is updated with the locations of the one or more wordlines, such that when programming to the one or more wordlines, a multi-loop programming operation is utilized. Read failures may occur due to grown failures due to the SLC program pulse with no SLC verify. The grown failures are not identified as program failures because of the no SLC verify operation. However, the grown failures may be detected as an EPWR failure or a read failure triggering XOR parity data or ECC data to be utilized to recover the data associated with the read failure.

Figure 5:
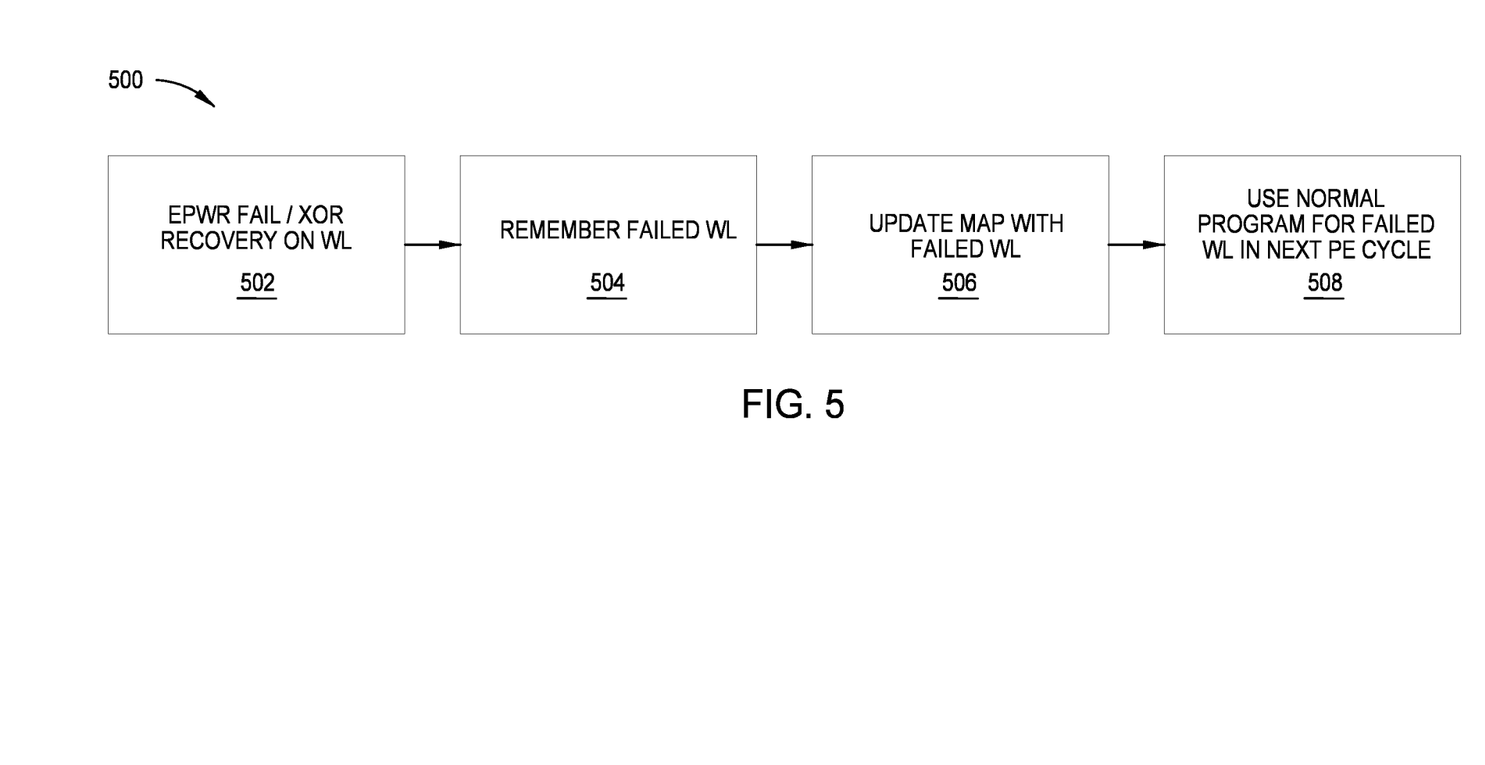
FIG. 5 is a block diagram illustrating a method of updating the map of wordlines, according to certain embodiments.

FIG. 5 is a block diagram illustrating a method 500 of updating the map of wordlines, according to certain embodiments. It is to be understood that the term "map" may refer to data structure, herein. At block 502, the controller, such as the controller 108 of FIG. 1, determines that a wordline has either an EPWR fail or requires XOR parity recovery due to a read fail. At block 504, the controller 108 remembers the failed wordline. At block 506, the map, such as the map described in FIG. 4, is updated with the location of the failed wordline, such that subsequent program operations to that failed wordline utilizes a multi-loop program operation rather than a single SLC program pulse without a SLC verify operation. At block 508, the multi-loop program operation is utilized for the failed wordline in the next program/erase (PE) cycle.

Figure 6:
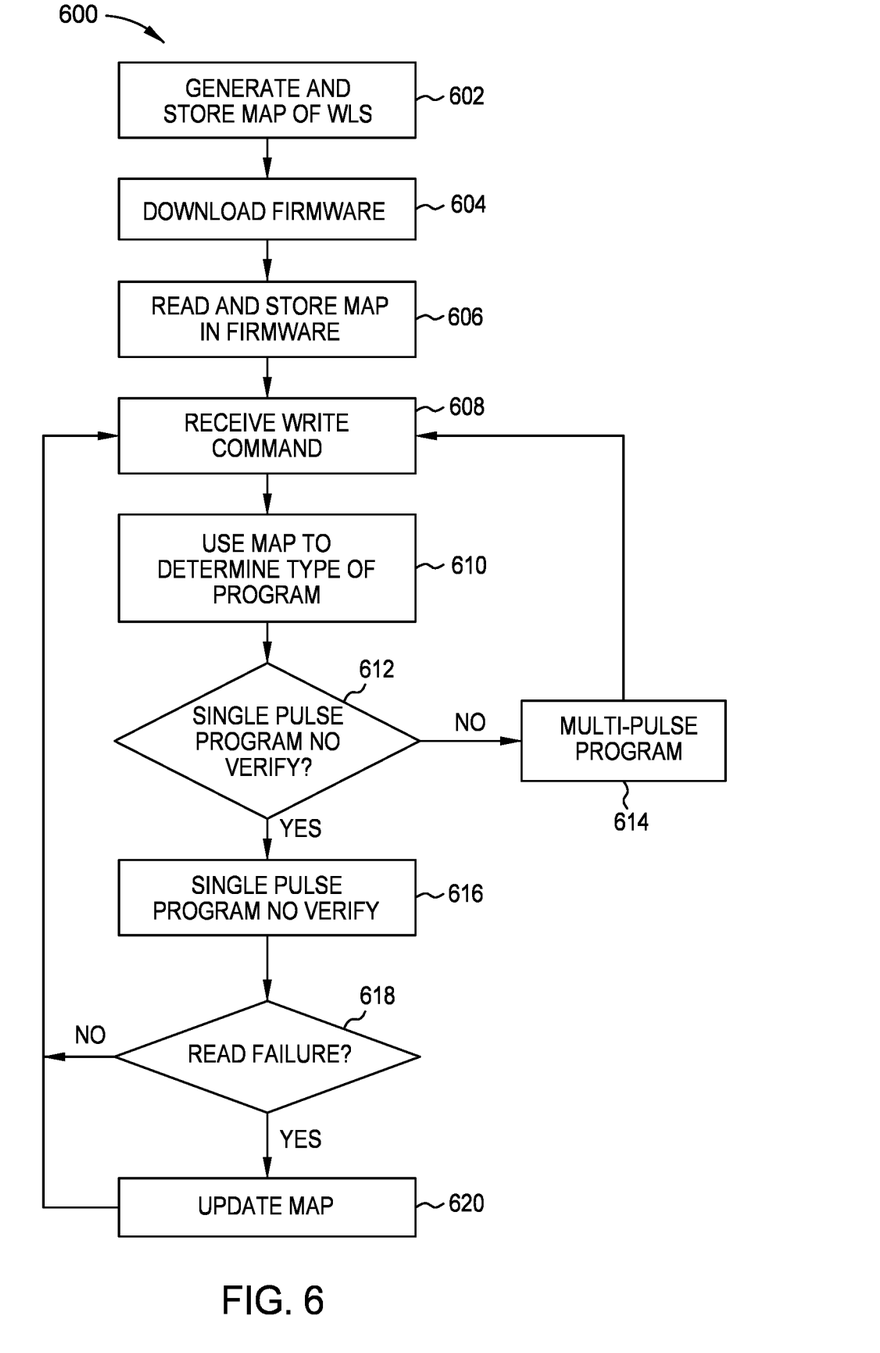
FIG. 6 is a block diagram illustrating a method of an adaptive program verify scheme, according to certain embodiments.

FIG. 6 is a block diagram illustrating a method 600 of an adaptive program verify scheme, according to certain embodiments. Aspects of the method 600 may be similar to aspects of the method 500. At block 602, a map of the wordlines is generated and stored either in the NVM, such as the NVM 110, or the Userrom. The map includes information regarding which wordlines of the NVM requires a multi-loop program operation or a single SLC program pulse with no SLC verify operation. The map may be generated and stored during the quality and assurance testing of the NVM 110 during the manufacturing process.

At block 604, the firmware is downloaded to the data storage device, such as the data storage device 106 of FIG. 1. At block 606, the map is read and stored in a data structure of the firmware. In some examples, the controller 108 is configured to place the map in a dedicated block of the NVM 110. In another example, the data structure is a bit map. At block 608, the controller, such as the controller 108 of FIG. 1, receives a write command from the host, such as the host device 104 of FIG. 1. At block 610, the controller 108 or the firmware utilizes the stored map to determine whether the location (i.e., the target wordline) associated with the write command requires a multi-loop program operation or a single SLC program pulse with no SLC verify operation.

At block 612, the controller 108 determines whether the relevant wordline requires the single SLC program pulse with no SLC verify operation. If the controller 108 determines that the relevant wordline requires a multi-loop program, a multi-loop program is executed to complete the write command at block 614. After completing the multi-loop program at block 614, the method 600 returns to block 608, where the controller 108 waits to receive a write command from the host device 104. However, if the relevant wordline requires the single SLC program pulse with no SLC verify operation at block 612, then at block 616, the controller 108 programs the relevant wordline with the single SLC program pulse with no SLC verify operation.

At block 618, the controller 108 determines whether the relevant wordline has a read failure. The read failure may be determine due to an EPWR failure or the relevant wordline requiring XOR parity. If the relevant wordline has a read failure at block 618, then the map is updated, such that subsequent program operations to the relevant wordline utilizes the multi-loop program, at block 620. An indication associated with the relevant wordline may be appended to the map. However, if the relevant wordline does not have a read failure at block 618, the method 600 returns to block 608, where the controller 108 waits to receive a write command from the host device 104.

By generating, storing, and updating a map of wordlines with a status of whether a single SLC program pulse with no SLC verify operation or a multi-loop program operation is required, burst performance may be improved by decreasing the SLC program time significantly and the single SLC program pulse with no SLC verify operation may be implemented to existing products.

In one embodiment, a data storage device includes a memory device and a controller coupled to the memory device. The controller is configured to determine one or more first wordlines within the memory device that need more than one pulse for programming and one or more second wordlines within the memory device that need one pulse with zero verifications for programming, generate a map of the one or more first wordlines, store the map in a data structure of the data storage device, and program the memory device. The programming includes programming the one or more second wordlines with one pulse and zero verifications and programming the one or more first wordlines with more than one pulse.

The generating occurs during memory testing. The controller is configured to place the map in a dedicated block of the memory device. The configured to read the map during downloading and execution of firmware. The programming the one or more second wordlines with one pulse and zero verifications includes programming a wordline with one voltage pulse and not verifying whether the pulse successfully programed the wordline. The programming the one or more first wordlines with more than one pulse programming includes delivering a first voltage pulse to a wordline, determining that the first voltage pulse did not program the wordline, and delivering a second voltage pulse greater than the first voltage pulse to the wordline. The one or more first wordlines are in SLC memory. The one or more second wordlines are in SLC memory. The controller is further configured to determine read failures of the one or more second wordlines. The controller is further configured to append to the map an indication of any wordline of the one or more second wordlines that has read failures. The controller is further configured to program any wordline of the one or more second wordlines that has a read failure with more than one pulse after determining the read failure.

In another embodiment, a data storage device includes a memory device and a controller coupled to the memory device. The controller is configured to read a data structure within the memory device that indicates one or more first wordlines within the memory device needs more than one pulse for programming and one or more second wordlines within the memory device needs one pulse with zero verifications for programming, determine a read failure on at least one wordline of the one or more second wordlines, and append, to the data structure, a notation of the read failure of the at least one wordline of the one or more second wordlines.

The data structure includes a bit map. The read failure is determined by an XOR parity check. The appending occurs each time a read failure is determined. Any wordlines with a read failure are notated as wordlines that need more than one pulse for programming. The data structure is generated during memory testing. The determining and appending occurs during data storage device runtime operation.

In another embodiment, a data storage device includes memory means, means to generate a data structure of wordlines in the memory means that need more than one pulse for programming, and means to append to the data structure an indication of which wordlines have read failures.

The means to append is configured to append to the data structure each time a read failure is identified. The data storage device further includes means to program the memory means based upon the data structure and appendages to the data structure.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
    a memory device; and
    a controller coupled to the memory device, wherein the controller is configured to:
        determine one or more first wordlines within the memory device that need more than one pulse for programming and one or more second wordlines within the memory device that need one pulse with zero verifications for programming;
        generate a map of the one or more first wordlines;
        store the map in a data structure of the memory device; and
        program the memory device, wherein the programming comprises:
            programming the one or more second wordlines with one pulse and zero verifications; and
            programming the one or more first wordlines with more than one pulse.

2. The data storage device of claim 1, wherein the generating occurs during memory testing.

3. The data storage device of claim 1, wherein the controller is configured to place the map in a dedicated block of the memory device.

4. The data storage device of claim 1, wherein the controller is configured to read the map during downloading and execution of firmware.

5. The data storage device of claim 1, wherein the programming the one or more second wordlines with one pulse and zero verifications comprises programming a wordline with one voltage pulse and not verifying whether the pulse successfully programed the wordline.

6. The data storage device of claim 1, wherein the programming the one or more first wordlines with more than one pulse programming comprises:
    delivering a first voltage pulse to a wordline;
    determining that the first voltage pulse did not program the wordline; and
    delivering a second voltage pulse greater than the first voltage pulse to the wordline.

7. The data storage device of claim 1, wherein the one or more first wordlines are in SLC memory.

8. The data storage device of claim 7, wherein the one or more second wordlines are in SLC memory.

9. The data storage device of claim 1, wherein the controller is further configured to determine read failures of the one or more second wordlines.

10. The data storage device of claim 9, wherein the controller is further configured to append to the map an indication of any wordline of the one or more second wordlines that has read failures.

11. The data storage device of claim 10, wherein the controller is further configured to program any wordline of the one or more second wordlines that has a read failure with more than one pulse after determining the read failure.

12. A data storage device, comprising:
    a memory device; and
    a controller coupled to the memory device, wherein the controller is configured to:
        read a data structure within the memory device that indicates one or more first wordlines within the memory device needs more than one pulse for programming and one or more second wordlines within the memory device needs one pulse with zero verifications for programming;
        determine a read failure on at least one wordline of the one or more second wordlines; and
        append, to the data structure, a notation of the read failure of the at least one wordline of the one or more second wordlines.

13. The data storage device of claim 12, wherein the data structure comprises a bit map.

14. The data storage device of claim 12, wherein the read failure is determined by an XOR parity check.

15. The data storage device of claim 12, wherein the appending occurs each time a read failure is determined.

16. The data storage device of claim 12, wherein any wordlines with a read failure are notated as wordlines that need more than one pulse for programming.

17. The data storage device of claim 12, wherein the data structure is generated during memory testing and wherein the determining and appending occurs during data storage device runtime operation.

18. A data storage device, comprising:
means for storing data; and
a controller coupled to the means for storing data, wherein the controller is configured to:
generate a data structure for one or more first wordlines within the means for storing data that need more than one pulse for programming and for one or more second wordlines within the means for storing data that need one pulse with zero verifications for programming; and
append to the data structure an indication of which wordlines have read failures.

19. The data storage device of claim 18, wherein the controller is further configured to append to the data structure each time a read failure is identified.

20. The data storage device of claim 18, wherein the controller is further configured to program to the means for storing data based upon the data structure and appendages to the data structure.

* * * * *